(12) United States Patent
Sasaki et al.

(10) Patent No.: US 10,999,937 B2
(45) Date of Patent: May 4, 2021

(54) ELECTRONIC DEVICE

(71) Applicant: Omron Corporation, Kyoto (JP)

(72) Inventors: Satoru Sasaki, Aichi (JP); Tomoyoshi Kobayashi, Aichi (JP); Masato Kasashima, Aichi (JP); Akihiro Kojima, Aichi (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 16/404,999

(22) Filed: May 7, 2019

(65) Prior Publication Data

US 2019/0343007 A1 Nov. 7, 2019

(30) Foreign Application Priority Data

May 7, 2018 (JP) .............................. JP2018-089094

(51) Int. Cl.
| | |
|---|---|
| *H05K 7/00* | (2006.01) |
| *H05K 3/30* | (2006.01) |
| *H05K 1/02* | (2006.01) |
| *H01G 9/00* | (2006.01) |
| *H05K 7/12* | (2006.01) |
| *H05K 1/18* | (2006.01) |

(52) U.S. Cl.
CPC .............. *H05K 3/301* (2013.01); *H01G 9/00* (2013.01); *H05K 1/02* (2013.01); *H05K 1/18* (2013.01); *H05K 3/306* (2013.01); *H05K 7/12* (2013.01); *H05K 2201/10007* (2013.01)

(58) Field of Classification Search
USPC ......................................................... 361/760
See application file for complete search history.

(56) References Cited

U.S. PATENT DOCUMENTS

| | | | | |
|---|---|---|---|---|
| 7,361,983 B2* | 4/2008 | Hayashi | ............ | H01L 23/49541 257/666 |
| 9,980,404 B2* | 5/2018 | Fidalgo | ............ | G06K 19/07769 |
| 2013/0188318 A1* | 7/2013 | I | ............... | H05K 7/20481 361/713 |
| 2014/0008811 A1* | 1/2014 | Yap | ................... | H01L 23/49861 257/774 |

FOREIGN PATENT DOCUMENTS

| | | |
|---|---|---|
| JP | S52-20564 U | 2/1977 |
| JP | S63-174492 U | 11/1988 |
| JP | S64-30851 U | 2/1989 |
| JP | H06-275471 A | 9/1994 |

* cited by examiner

*Primary Examiner* — Andargie M Aychillhum
(74) *Attorney, Agent, or Firm* — Osha Bergman Watanabe & Burton LLP

(57) ABSTRACT

An electronic device includes: an electronic component; and a mounting member on which the electronic component is mounted. A center of gravity of the electronic component is at a position separated from the mounting member. The electronic device further includes: a rigid member having a frame shape, which is fixed to the mounting member and surrounds the electronic component in a direction perpendicular to a direction from the center of gravity of the electronic component to the mounting member; and a connecting member which connects the electronic component to the rigid member on a side opposite to the mounting member with respect to the electronic component.

6 Claims, 8 Drawing Sheets

ELECTRONIC DEVICE

CROSS-REFERENCES TO RELATED APPLICATIONS

This application is based upon and claims the benefit of priority from Japanese Patent Application No. 2018-089094, filed on May 7, 2018; the entire contents of which are incorporated herein by reference.

FIELD

One or more embodiments of the present invention relate to a vibration prevention structure of an electronic component provided in an electronic device.

BACKGROUND

An electronic device including an electronic component and a printed circuit board on which the electronic component is mounted is used for various purposes. The types of the electronic component mounted on the printed circuit board include an electronic component of a surface mount type and an electronic component of an insertion mount type.

The electronic component of the surface mount type is also called a surface mount component, a surface mount device (SMT), or a chip component and includes a main body portion and a connecting portion such as a terminal and an electrode exposed from the main body portion and connected to the printed circuit board. In the electronic component of the surface mount type, for example, the main body portion is disposed on a surface of the printed circuit board, and the terminal and the electrode are connected to a land or the like provided on the surface of the circuit board by solder or the like.

The electronic component of the insertion mount type is also called a lead component or a through-hole component, and includes a main body portion and a connecting portion such as a lead terminal protruding from the main body portion and being connected to the printed circuit board. In the electronic component of the insertion mount type, for example, the main body portion is disposed on the surface of the printed circuit board, and the lead terminal is connected to the printed circuit board by solder or the like in a state where the lead terminal is inserted in a through-hole formed in the printed circuit board.

Generally, the electronic component of the insertion mount type is larger than the electronic component of the surface mount type, and a height of the main body portion from the printed circuit board is high in a mounted state. In addition, a center of gravity of the electronic component is within the main body portion separated from the printed circuit board, and the main body portion is supported by the lead terminal having a smaller sectional area than the main body portion. Therefore, in a case where external force such as vibration and impact is externally applied to the electronic device, the main body portion of the electronic component of the insertion mount type is likely to oscillate, and stress is generated in the electronic component. Accordingly, there is a possibility that the soldered part of the lead terminal and the lead terminal may be damaged. In addition, such a problem is likely to occur even in the electronic component of the surface mount type in which the center of gravity is within the main body portion separated from the printed circuit board. Accordingly, various vibration prevention structures for the electronic component have been proposed.

For example, in JP-U-S52-20564, a rectangular parallelepiped main body portion of a lead component (indication plate) disposed on an upper surface of a circuit board is surrounded from three sides by a synthetic resin attachment body fixed to the upper surface of the printed circuit board. The elastic tongue piece provided on the attachment body is brought into contact with the main body portion of the lead component, and the buffer body is interposed between the main body portion of the lead component opposite to the elastic tongue piece and the attachment body. Accordingly, the main body portion is elastically supported, and the external vibration is absorbed by the buffer body.

Further, in JP-U-S64-30851, a main body portion of a lead component (power transistor) is connected to a metal housing of an electronic device via a thermally conductive adhesive, an insulation sheet, or a heat sink. A lead terminal of the lead component is connected to a printed circuit board via a wire.

Further, in JP-U-S63-174492, a main body portion of a lead component (a capacitor, a transistor, or a resistor) is separated from an upper surface of a printed circuit board. A soft and elastic vibration prevention material is interposed between the main body portion and the printed circuit board, or the entire main body portion is covered with the vibration prevention material.

Further, in JP-A-H06-275471, lower portions of a plurality of electrolytic capacitors are elastically supported by a rubber plate placed on an upper surface of a circuit board. In addition, upper portions of the plurality of electrolytic capacitors are elastically supported by the rubber plate disposed above the circuit board via a support. Terminals provided on the upper portions of the plurality of electrolytic capacitors are connected to a bus bar disposed above the circuit board via the support and a damper.

SUMMARY

External force such as vibration and impact from a vehicle body or an engine is applied to a vehicle mounted electronic device, for example. Especially, the large vibration or impact from the engine during traveling of a vehicle or the like is applied to the electronic device installed in a vicinity of the engine. Therefore, a vibration prevention structure of an electronic component in related art does not withstand the vibration and impact, and the electronic component oscillates. Accordingly, there is a possibility that a connecting part of the electronic component and the electronic component itself are damaged.

One or more embodiments of the present invention provide an electronic device capable of improving vibration resistance and impact resistance of an electronic component.

According to one or more embodiments of the present invention, there is provided an electronic device including an electronic component and a mounting member on which the electronic component is mounted, wherein the electronic device in which a center of gravity of the electronic component is at a position separated from the mounting member further includes a rigid member having a frame shape, which is fixed to the mounting member and surrounds the electronic component in a direction perpendicular to a direction from the center of gravity of the electronic component to the mounting member, and a connecting member which connects the electronic component to the rigid member on a side opposite to the mounting member with respect to the electronic component.

According to one or more embodiments above, since one side of the electronic component is constrained by the mounting member and the other side of the electronic component is constrained by the connecting member and the rigid member, it is possible to suppress oscillation of the electronic component due to external force such as vibration and impact from outside. Further, even if the external force such as the large vibration and impact is externally applied to the electronic device, the stress generated in the electronic component due to the external force can be absorbed by the rigid member via the connecting member. Therefore, it is possible to prevent damage of the connecting part of the electronic component in the mounting member and the electronic component itself and to improve the vibration resistance and the impact resistance of the electronic component.

Further, in one or more embodiments of the present invention, the plurality of electronic components may be provided, where each of the electronic components may have a main body portion, and a connecting portion exposed from the main body portion and connected to the mounting member, the plurality of electronic components may be arranged on the mounting member such that the main body portions are close to each other, and the connecting member may connect the main body portions of the plurality of electronic components to each other and connect the main body portions of at least the electronic components disposed at both ends to the rigid member.

Further, in one or more embodiments of the present invention, the connecting member may connect the main body portion of each of the electronic components to the rigid member.

Further, in one or more embodiments of the present invention, the plurality of electronic components may have a same shape, where one of widths of the main body portion of each of the electronic components, the widths being in a direction parallel to a surface of the mounting member, may be smaller than another of the widths, and the plurality of electronic components are arranged such that the main body portions may be adjacent to each other in a direction of the one width.

Further, in one or more embodiments of the present invention, the connecting member may be made of an adhesive having viscosity at a time of application and elasticity after curing.

Further, in one or more embodiments of the present invention, the mounting member may be configured by a circuit board, and the electronic component may be configured by an electronic component of an insertion mount type, which includes a lead terminal connected to the circuit board in a state of the lead terminal being inserted into a through-hole formed in the circuit board.

According to one or more embodiments of the present invention, it is possible to provide the electronic device capable of improving the vibration resistance and the impact resistance of the electronic component.

DETAILED DESCRIPTION

Figure 1:
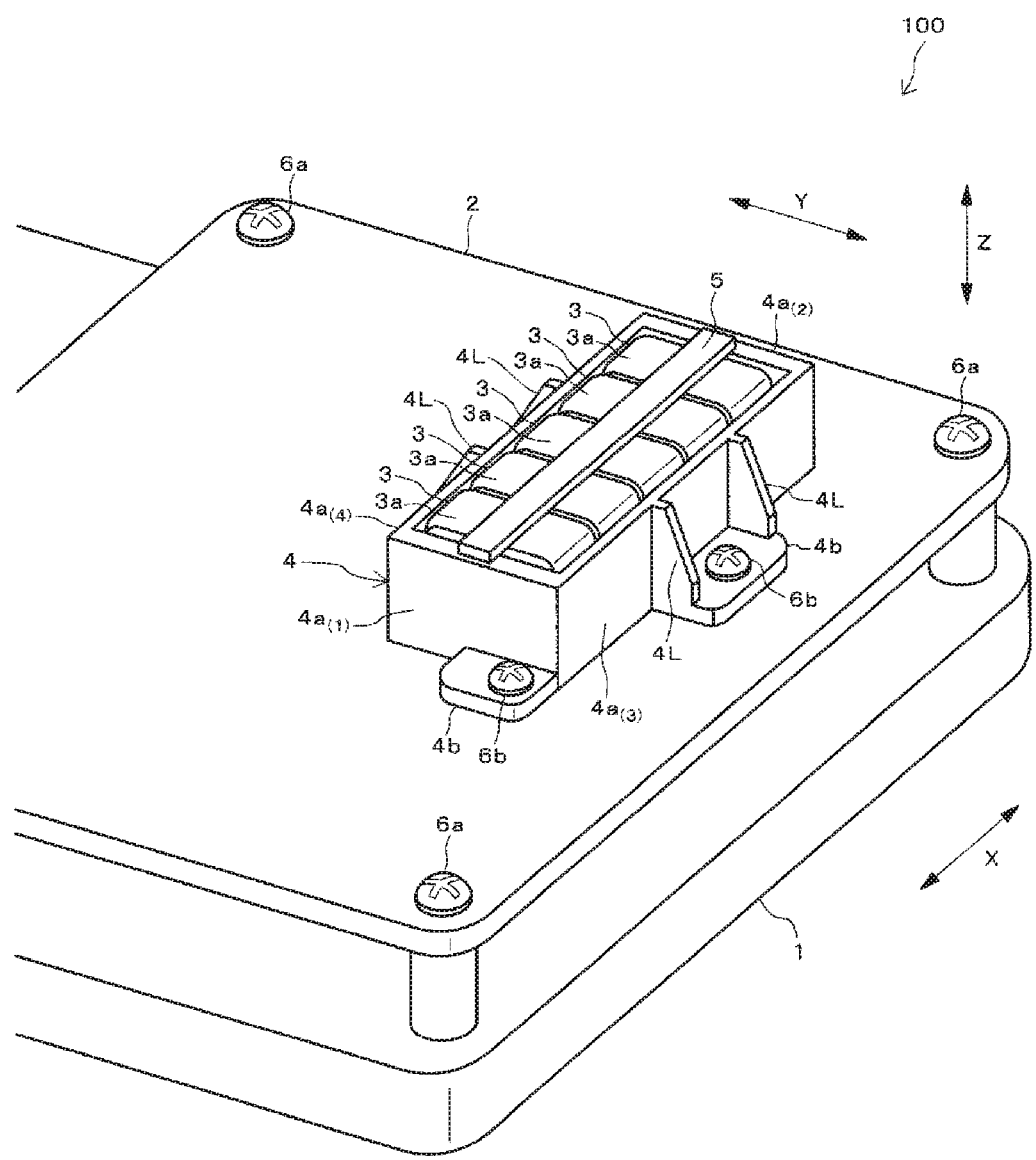
FIG. 1 is a perspective view of a main unit of an electronic device according to a first embodiment of the present invention.

In embodiments of the invention, numerous specific details are set forth in order to provide a thorough understanding of the invention. However, it will be apparent to one of ordinary skill in the art that the invention may be practiced without these specific details. In other instances, well-known features have not been described in detail to avoid obscuring the invention. Hereinafter, one or more embodiments of the present invention will be described with reference to the drawings. In each figure, the same parts or corresponding parts will be given the same reference characters.

Figure 2:
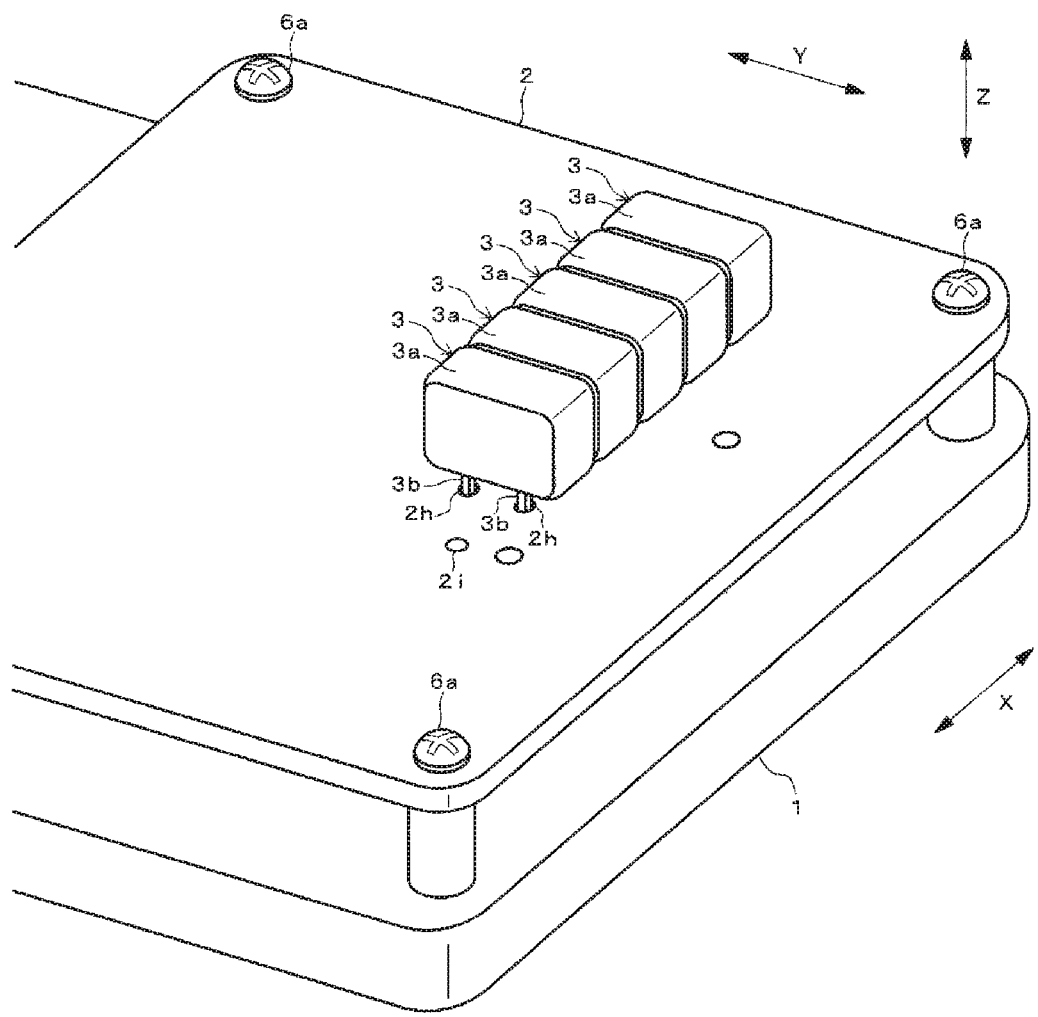
FIG. 2 is a perspective view showing a state in which a rigid member and a connecting member are removed from FIG. 1.
Figure 3:
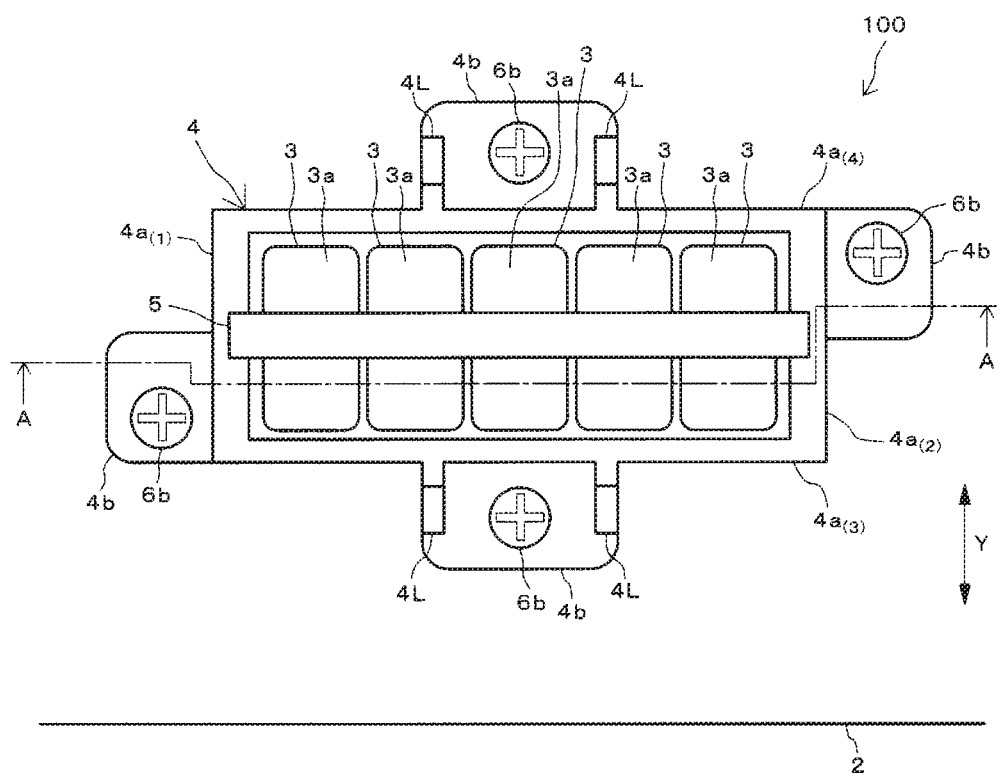
FIG. 3 is a plan view of the main unit of the electronic device of FIG. 1.
Figure 4:
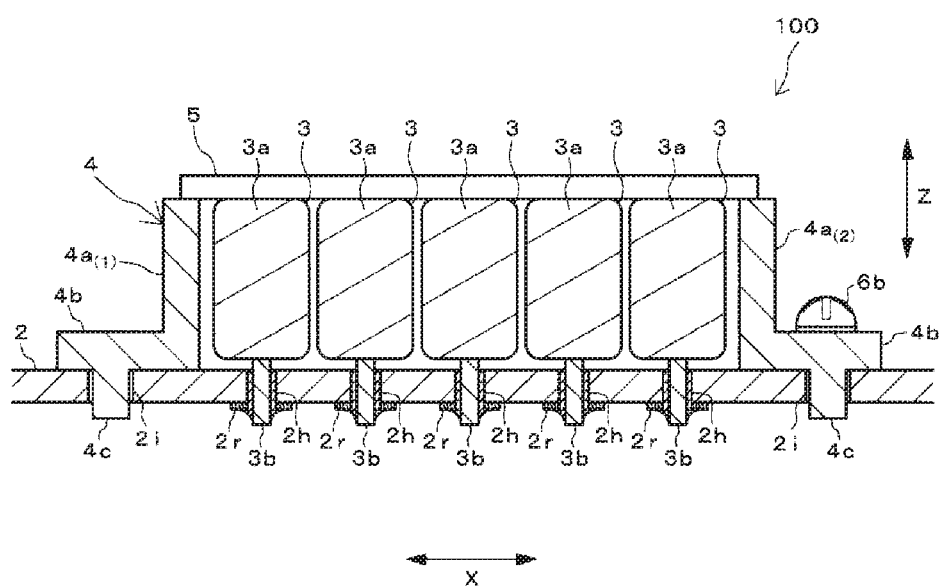
FIG. 4 is a sectional view taken along a line A-A of FIG. 3.

FIG. 1 is a perspective view of a main unit of an electronic device 100 according to a first embodiment of the present invention. FIG. 2 is a perspective view of a state in which a rigid member 4 and a connecting member 5 are removed from FIG. 1. FIG. 3 is a plan view of a main unit of the electronic device 100. FIG. 4 is a sectional view taken along a line A-A of FIG. 3.

The electronic device 100 is, for example, a vehicle mounted DC-DC converter and is installed in a vicinity of an engine of a vehicle.

As shown in FIG. 1 and FIG. 2, a circuit board 2 is fixed to a housing 1 of the electronic device 100 by a plurality of screws 6a. Specifically, although not shown in detail, the circuit board 2 has a plurality of through-holes that allow each screw 6a to penetrate therethrough, and a plurality of screw holes for screwing each screw 6a are formed in the housing 1. The circuit board 2 is fixed to the housing 1 by passing each screw 6a through the through-hole of the circuit board 2 and screwing each screw 6a into the screw hole of the housing 1. Although the housing 1 is made of metal in this example, it may be made of other material such as synthetic resin. The circuit board 2 is constituted with a printed circuit board.

A plurality of electronic components are mounted on the circuit board 2. The plurality of electronic components include a lead component 3. In FIG. 1, illustration of electronic components other than the lead component 3 mounted on the circuit board 2 is omitted. The lead component 3 is constituted with, for example, an electrolytic capacitor, and the plurality of lead components (five) are provided in the electronic device 100. A shape of each lead component 3 is the same. The circuit board 2 is an example of a "mounting member" of one or more embodiments of the present invention. The lead component 3 is an example of an "electronic component of an insertion mount type" of one or more embodiments of the present invention.

Figure 5A:
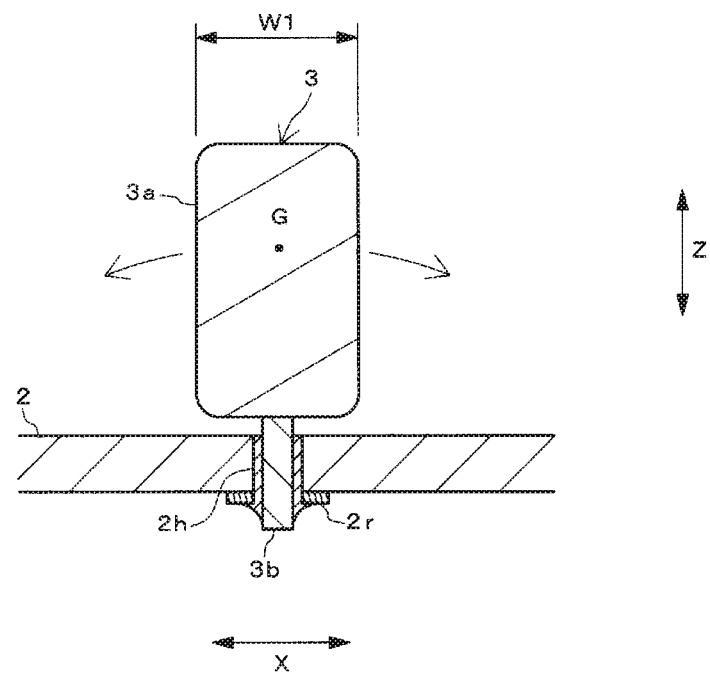
FIGS. 5A and 5B are side sectional views showing mounted states of lead components.
Figure 5B:
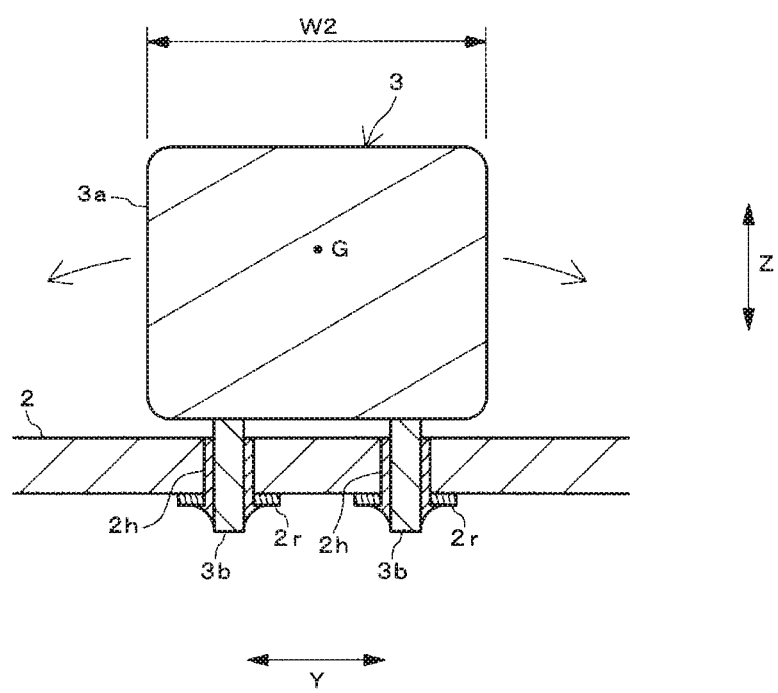

FIGS. 5A and 5B are side sectional views showing mounted states of the lead component 3. Each lead component 3 has a main body portion 3a and two lead terminals 3b exposed from the main body portion 3a. As shown in FIGS. 2 to 5, the main body portion 3a is formed in a rectangular parallelepiped shape. In this example, as shown in FIGS. 5A and 5B, one lateral width W1 of the main body portion 3a of the lead component 3 is smaller than the other lateral width W2 (W1<W2). Depending on a shape of the lead component 3, one lateral width W1 may be equal to the other lateral width W2 (W1=W2).

The two lead terminals 3b protrude downward from the main body portion 3a. Further, the two lead terminals 3b are arranged in a direction of the width W2 (Y direction) of the main body portion 3a (FIG. 2 and FIG. 5B).

The main body portions 3a of the plurality of lead components 3 are arranged on an upper surface of the circuit board 2. The plurality of lead components 3 are arranged so that the respective main body portions 3a are adjacent to each other in a direction of the width W1 (X direction) (FIGS. 1 to 4). In the present example, as shown in FIG. 4 or the like, the main body portions 3a of the adjacent lead components 3 are separated from each other, but the adjacent main body portions 3a may be in contact with each other.

The lead terminal 3b of each lead component 3 is connected to a land 2r provided around a through-hole 2h on a lower surface of the circuit board 2 by solder in a state of the lead terminal 3b being inserted into the through-hole 2h formed in the circuit board 2 (FIG. 4 and FIGS. 5A and 5B). The tip of the lead terminal 3b protrudes downward from the circuit board 2. The lead terminal 3b is an example of a "connecting portion" of one or more embodiments of the present invention.

The main body portion 3a of each lead component 3 is larger in size and heavier in weight than the lead terminal 3b. In a state where the lead component 3 is mounted on the circuit board 2, a center of gravity G of the lead component 3 is positioned above a center of the main body portion 3a separated from the circuit board 2, as shown in FIGS. 5A and 5B.

As shown in FIGS. 1 and 3, a rigid member 4 is provided around the main body portion 3a of each lead component 3. The rigid member 4 is made of synthetic resin and has side walls $4a_{(1)}$ to $4a_{(4)}$ formed in a rectangular frame shape when viewed from a vertical direction Z parallel to a plate thickness direction of the circuit board 2. The side walls $4a_{(1)}$ to $4a_{(4)}$ surround the main body portions 3a of the lead components 3 positioned on the circuit board 2, over an entire circumference thereof from a lateral direction (direction parallel to a plate surface of the circuit board 2) perpendicular with respect to the direction (vertical direction Z) directed from the center of gravity G (FIGS. 5A and 5B) of the lead component 3 toward the circuit board 2. As shown in FIG. 4, heights of the side walls $4a_{(1)}$ to $4a_{(4)}$ from the circuit board 2 are equal to a height of the main body portion 3a of the lead component 3.

In FIG. 4 or the like, although the main body portions 3a of the lead components 3 at both ends are separated with respect to the first side wall $4a_{(1)}$ and the second side wall $4a_{(2)}$ which are parallel to the short side direction Y of the rigid member 4 among the side walls $4a_{(1)}$ to $4a_{(4)}$, these side walls $4a_{(1)}$ and $4a_{(2)}$ and the main body portion 3a may be in contact with each other.

As shown in FIGS. 1, 3, and 4, a leg portion 4b is provided on a lower portion of each side walls $4a_{(1)}$ to $4a_{(4)}$. Each leg portion 4b projects laterally parallel to the plate surface of the circuit board 2. As shown in FIG. 4, each leg 4b projecting in the long side direction X of the rigid member 4 is provided with a boss 4c protruding downward. A through-hole 2i for the insertion of each boss 4c is formed in the circuit board 2. By inserting each boss 4c into each through-hole 2i of the circuit board 2, the rigid member 4 is positioned on the circuit board 2.

Thus, the rigid member 4 is fixed to the circuit board 2 and the housing 1 by a plurality of screws 6b shown in FIG. 3 or the like. Specifically, although not shown in the figure, the plurality of through-holes passing each screw 6b therethrough are formed in each leg portion 4b of the rigid member 4 and the circuit board 2, and the plurality of screw holes are formed in the housing 1 so as to communicate with the through-holes. The rigid member 4 is fixed to the circuit board 2 and the housing 1 by passing each screw 6b through the through-hole of each leg portion 4b and the through-hole of the circuit board 2 and screwing the screw 6b into the screw hole of the housing 1.

As shown in FIGS. 1 and 3, a plurality of ribs 4L are provided on outer surfaces of the third side wall $4a_{(3)}$ and the fourth side wall $4a_{(4)}$ which are parallel to the long side direction X of the rigid member 4. Each rib 4L extends in the height direction Z of the third side wall $4a_{(3)}$, and the fourth side wall $4a_{(4)}$ and protrudes laterally as going downward. Further, each rib 4L is continuous with the leg portions 4b provided on the side walls $4a_{(3)}$ and $4a_{(4)}$.

A connecting member 5 made of a silicon-based or rubber-based adhesive is provided above the rigid member 4 and the main body portion 3a of each lead component 3. The adhesive is in a liquid state and has viscosity at a time of application and has elasticity after curing.

After mounting each lead component 3 on the circuit board 2, surrounding each lead component 3 with the rigid member 4, and fixing the rigid member 4 to the circuit board 2, the adhesive (connecting member 5) in a liquid state is applied over the first side wall $4a_{(1)}$, the main body portion 3a of each lead component 3, and the second side wall $4a_{(2)}$ in the long side direction X of the rigid member 4, from above. Then, by hardening the adhesive (connecting member 5), the main body portions 3a of the plurality of lead components 3 are connected to each other by the connecting member 5, and the main body portions 3a of the lead components 3 at both ends are connected to the first side wall $4a_{(1)}$ and the second side wall $4a_{(2)}$ of the rigid member 4 by the connecting member 5. Thereafter, the electronic device 100 is assembled by covering the electronic component including the circuit board 2 and the lead component 3 with a cover (not shown) and attaching the cover to the housing 1.

As described above, since the electronic device 100 is installed in the vicinity of the engine of the vehicle, external force such as large vibration and impact from the engine is applied to each portion of the electronic device 100. As shown in FIGS. 5A and 5B, since the center of gravity G of the lead component 3 is positioned at a position higher than the center of the main body portion 3a separated from the circuit board 2, there is a possibility that the main body portion 3a oscillates by the application of the external force as shown by arrows in FIGS. 5A and 5B.

In particular, as shown in FIG. 5A, since the plurality of lead terminals 3b are not arranged in the direction of the width W1 (X direction) which is a short side of the main body portion 3a of the lead component 3, the main body portion 3a is likely to oscillate in the X direction by the application of the external force as shown by the arrows. Further, since the main body portion 3a oscillates, a bending stress is applied to the lead terminal 3b. There is a possibility that the soldered part of the lead terminal 3b on the circuit board 2 is damaged (solder cracking or the like) and the lead terminal 3b itself breaks.

Figure 6A:
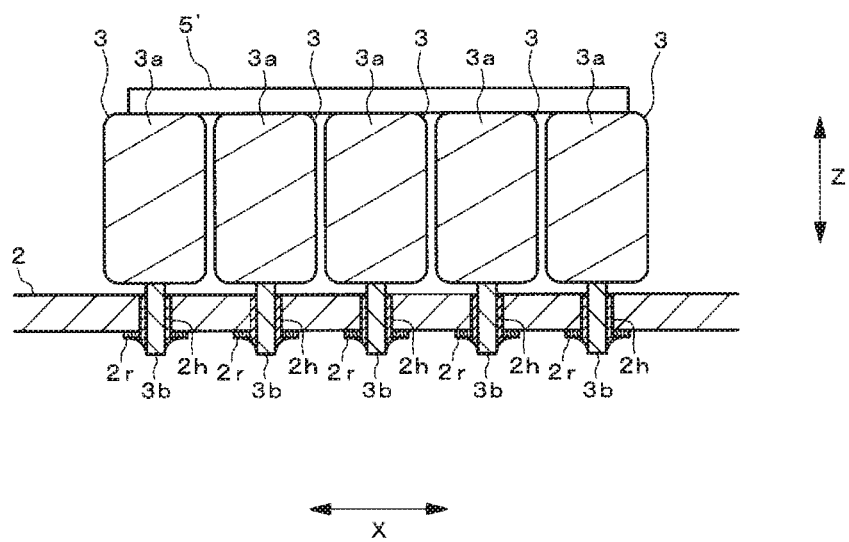
FIGS. 6A and 6B are views showing another connected state of the plurality of lead components.
Figure 6B:
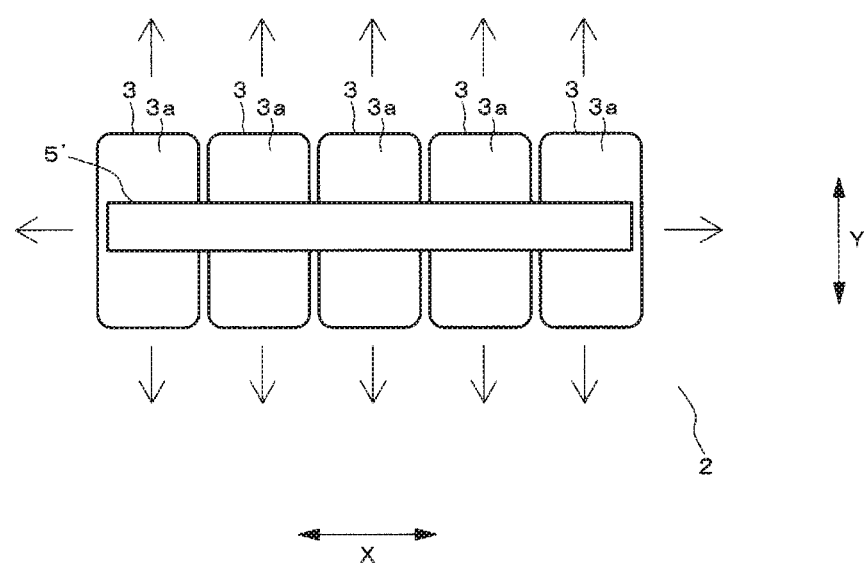

FIGS. 6A and 6B are views showing another connected state of the plurality of lead components 3. In FIGS. 6A and 6B, a sectional view in the connected state is shown in FIG. 6A, and a plan view is shown in FIG. 6B.

In FIGS. 6A and 6B, upper portions of the main body portions 3b of the plurality of lead components 3 arranged on the circuit board 2 are connected by a connecting member 5'. The connecting member 5' is made of the same adhesive as the above-mentioned connecting member 5. In this case, by soldering each lead terminal 3b to the circuit board 2, the lower portion of each lead component 3 is constrained, and the upper portion of each main body portion 3a is connected by the connecting member 5', so that the upper portion of each lead component 3 is also constrained. Accordingly, it is difficult for each lead component 3 to oscillate in the X direction. In addition, the stress generated in each lead component 3 due to the application of the external force is dispersed through the connecting member 5' to the plurality of lead components 3, so that the stress applied to each lead component 3 is reduced.

However, when the external force such as the large vibration and impact is applied from the engine, since the plurality of lead components 3 connected by the connecting member 5' are integrated, there is a possibility that the plurality of lead components 3 oscillate in the X direction or the Y direction as indicated by the arrows in FIG. 6B. Thus, since the plurality of lead component 3 oscillate in that manner, the bending stress is applied to each lead terminal 3b. There is a possibility that the soldered part of each lead terminal 3b is damaged and each lead terminal 3b itself breaks. In particular, among the plurality of lead components 3, the stress applied to the lead components 3 disposed at both ends is larger than the stress applied to the lead component 3 disposed at the center, so that the large bending stress is applied to the lead terminals 3b of the lead components 3 at both ends. Accordingly, the soldered part of the lead terminal 3b and the lead terminal 3b itself are easily damaged.

On the other hand, in the first embodiment shown in FIGS. 1, 3, and 4, the frame-like rigid member 4 which is structurally stable is fixed on the circuit board 2 of the electronic device 100, and the rigid member 4 surrounds the main body portions 3a of the plurality of lead components 3 mounted on the circuit board 2, from the sides over the entire circumference. Then, the main body portions 3a are connected to each other by the connecting member 5 on the side opposite to the circuit board 2 with respect to the main body portion 3a of the lead component 3, and the main body portions 3a of the lead components 3 at both ends are connected to the rigid member 4 by the connecting member 5.

Therefore, since the lower portion of each lead component 3 is constrained by the circuit board 2 and the upper portion of each lead component 3 is constrained by the connecting member 5 and the rigid member 4, it is possible to suppress the oscillation of each lead component 3 due to the external force such as the vibration and impact from outside. In addition, the stress generated in each lead component 3 due to the application of the external force is dispersed through the connecting member 5 to other lead components 3, so that the stress applied to each lead component 3 can be reduced. Further, unlike the cases of FIGS. 6A and 6B in which the rigid member 4 is not provided, the stress applied to the plurality of lead components 3 is transmitted from the main body portions 3a of the lead components 3 at both ends to the rigid member 4 via the connecting member 5, so that the stress can be absorbed by the rigid member 4. As a result, even if the external force such as the large vibration and impact is applied to the electronic device 100 from the engine of the vehicle, the main body portion 3a of the lead component 3 does not oscillate, and it is possible to prevent the soldered part of the lead terminal 3b and the lead terminal 3b itself from being damaged and to improve vibration resistance and impact resistance of the lead component 3.

In the first embodiment, the plurality of lead components 3 are arranged on the circuit board 2 so that the main body portions 3a of the respective lead components 3 are adjacent to each other in the direction of the short side width W1 (X direction). Therefore, it is possible to increase a degree of freedom in designing the circuit board 2 by reducing mounting space of the plurality of lead components 3 on the circuit board 2. In addition, the oscillation of the main body portion 3a of each lead component 3 can be further suppressed by connecting the main body portions 3a of the plurality of lead components 3 to each other and connecting the main body portions 3a at both ends to the rigid member 4 by the connecting member 5 in the X direction.

Further, in the first embodiment, the connecting member 5 is made of a silicone-based or rubber-based adhesive having viscosity at the time of application and having elasticity after curing. Therefore, the adhesive (connecting member 5) can be easily applied over the first side wall $4a_{(1)}$, the main body portion 3a of each lead component 3, and the second side wall $4a_{(2)}$, from above even if there are variations in a space between the main body portions 3a of the plurality of lead components 3 and a space between the main body portions 3a of the lead components 3 at both ends, and the first side wall $4a_{(1)}$ and the second side wall $4a_{(2)}$ of the rigid member 4. By hardening the adhesive (connecting member 5), it is possible to connect the main body portions 3a of the lead components 3 to each other and to connect the main body portions 3a at both ends with the walls $4a_{(1)}$ and $4a_{(2)}$ of the rigid member 4 by the connecting member 5, in a reliable manner. In addition, the external force such as the large vibration and impact from the engine is also absorbed by the connecting member 5 to reduce the stress applied to the lead component 3, and the oscillation of the lead component 3 is further suppressed. Accordingly, the vibration resistance and impact resistance of the lead component 3 can be further improved.

Figure 7:
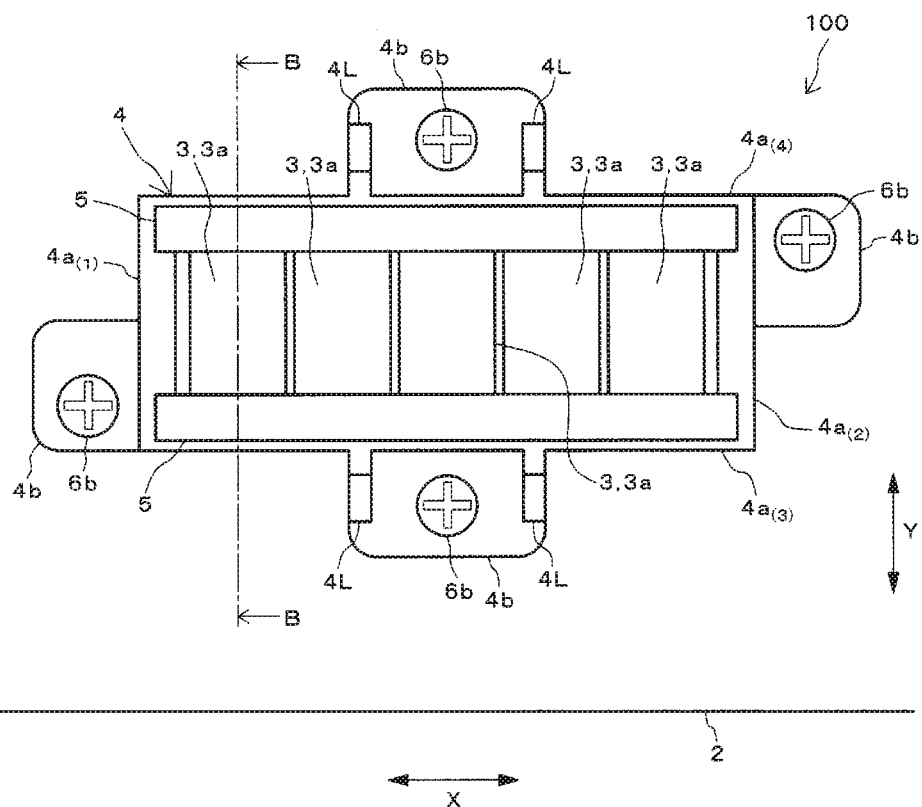
FIG. 7 is a plan view of a main unit of an electronic device according to a second embodiment of the present invention.
Figure 8:
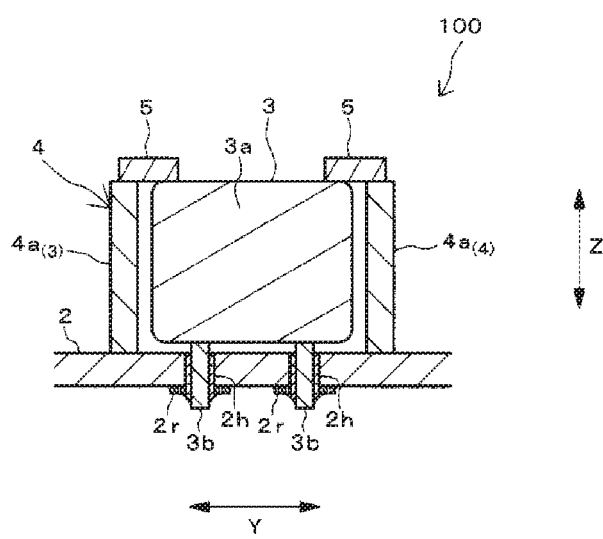
FIG. 8 is a sectional view taken along a line B-B of FIG. 7.

FIG. 7 is a plan view of a main unit of an electronic device 100 according to a second embodiment of the present invention. FIG. 8 is a sectional view taken along a line B-B of FIG. 7.

In the second embodiment, after mounting each lead component 3 to the circuit board 2 and surrounding the main body portion 3a of each lead component 3 with a rigid member 4, the rigid member 4 is fixed to the circuit board 2, and then the adhesive constituting the connecting member 5 is applied twice to different locations, so that the connecting member 5 connects the main body portions 3a of the lead components 3 to each other and connects each main body portion 3a with the side walls $4a_{(1)}$ to $4a_{(4)}$ of the rigid member 4 as shown in FIG. 7.

Specifically, the adhesive (connecting member 5) in a liquid state is applied from above over the first side wall $4a_{(1)}$ and the third side wall $4a_{(3)}$ of the rigid member 4, the main body portion 3a of each lead component 3, and the second side wall $4a_{(2)}$ in the X direction from above. Further, the adhesive is applied over the first side wall $4a_{(1)}$ and the fourth side wall $4a_{(4)}$ of the rigid member 4, the main body portion 3a of each lead component 3, and the second side wall $4a_{(2)}$ in the X direction. Then, by curing each adhesive applied in two rows, as shown in FIG. 7, the main body portions 3a of the plurality of lead components 3 are connected to each other at two positions by the connecting member 5, and as shown in FIG. 8, each main body portion 3a is connected to the side walls $4a_{(1)}$ to $4a_{(4)}$ of the rigid member 4 by the connecting member 5 at two or three locations.

According to the second embodiment described above, the external force such as the large vibration and impact applied from the engine of the vehicle generates the stress in each lead component 3, and the stress is transmitted to the rigid member 4 via each connecting member 5. Accordingly, the stress can be absorbed by the rigid member 4. Further, as shown in FIG. 8, the upper portions of the main body portion 3a of each lead component 3 at both ends in the Y direction are connected to the third side wall $4a_{(3)}$ and the fourth side wall $4a_{(4)}$ of the rigid member 4 by the connecting member 5, respectively. Accordingly, it is possible to suppress the oscillation of each main body portion 3a in the Y direction due to the external force as indicated by the arrows in FIG. 5B. As a result, it is possible to further improve the vibration resistance and the impact resistance of each lead component 3.

Figure 9:
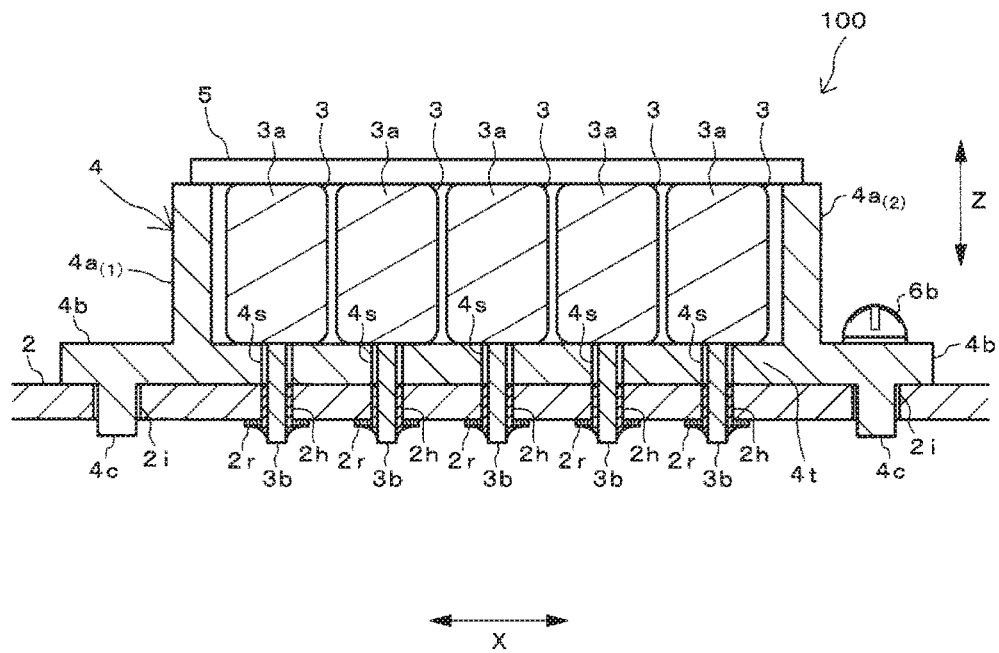
FIG. 9 is a sectional view showing another embodiment of the present invention.

One or more embodiments of the present invention can adopt various embodiments other than the embodiments mentioned above. For example, in the embodiments above, the case in which the main body portions 3a of the plurality of lead components 3 are surrounded from the sides by the rigid member 4 is shown, but one or more embodiments of the present invention are not limited thereto. In addition, for example, as shown in FIG. 9, a bottom wall 4t may be provided inside the rigid member 4 so that the main body portions 3a of the plurality of lead components 3 may be surrounded or supported from the side of the circuit board 2 by the bottom wall 4t. In other words, the rigid member 4 may be formed in a box shape so that the main body portions 3a of the plurality of lead components 3 may be housed inside. In this case, in order to mount each lead component 3 on the circuit board 2, a plurality of insertion holes 4s through which the lead terminal 3b of each lead component 3 is inserted may be formed in the bottom wall 4t so as to communicate with the plurality of through-holes 2h of the circuit board 2.

Further, in the above embodiments, the example is shown in which heights of the side walls $4a_{(1)}$ to $4a_{(4)}$ of the rigid member 4 from the circuit board 2 are set equal to the height of the main body portion 3a of the lead component 3 mounted on the circuit board 2, from the circuit board 2. However, one or more embodiments of the present invention are not limited thereto only, and the height of the side wall of the rigid member 4 may be different from the height of the main body portion 3a of the lead component 3.

Further, in the above embodiments, the example is shown in which the material of the rigid member 4 is synthetic resin, but one or more embodiments of the present invention are not limited thereto only, so that for example, the rigid member 4 may be formed of another material such as metal. Alternatively, for example, the rigid member 4 may be formed by using a metal piece as a core material and covering the metal piece with synthetic resin. In this case, rigidity of the rigid member 4 can be further enhanced.

In the above embodiments, the example is shown in which the connecting member 5 made of a silicon-based or rubber-based adhesive is used, but one or more embodiments of the present invention are not limited thereto only. In addition, for example, an adhesive made of another material, a double-sided tape, or the like may be used as the connecting member. Further, for example, the connecting member may be constituted by a plurality of members such as a molded article such as synthetic resin or rubber and an adhesive for bonding the molded article to the main body portion 3a of the lead component 3 and the rigid member 4.

Figure 10:
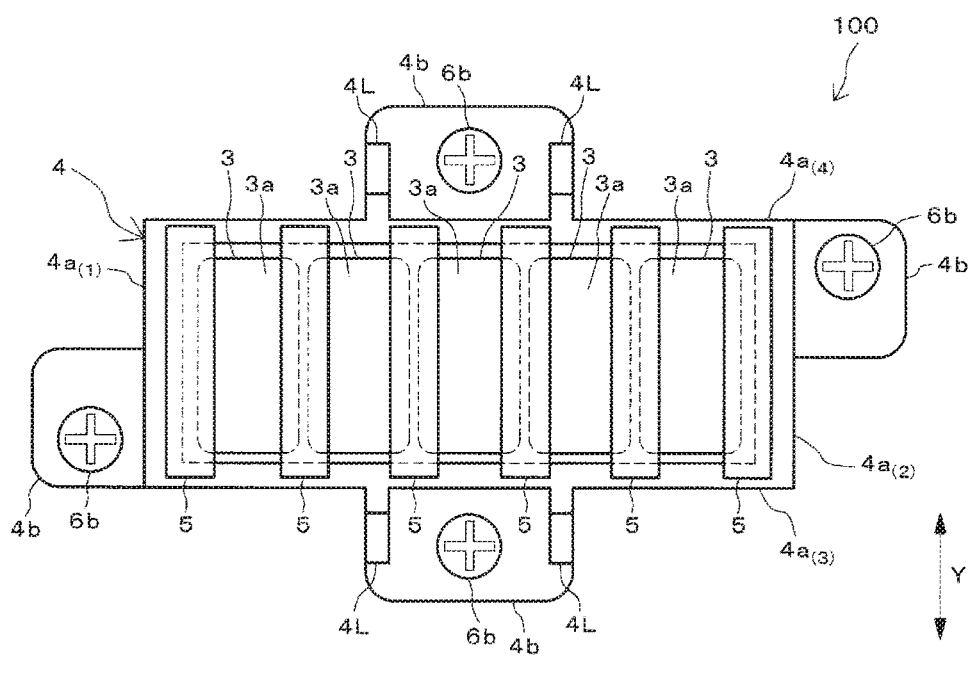
FIG. 10 is a plan view showing still another embodiment of the present invention.
Figure 11:
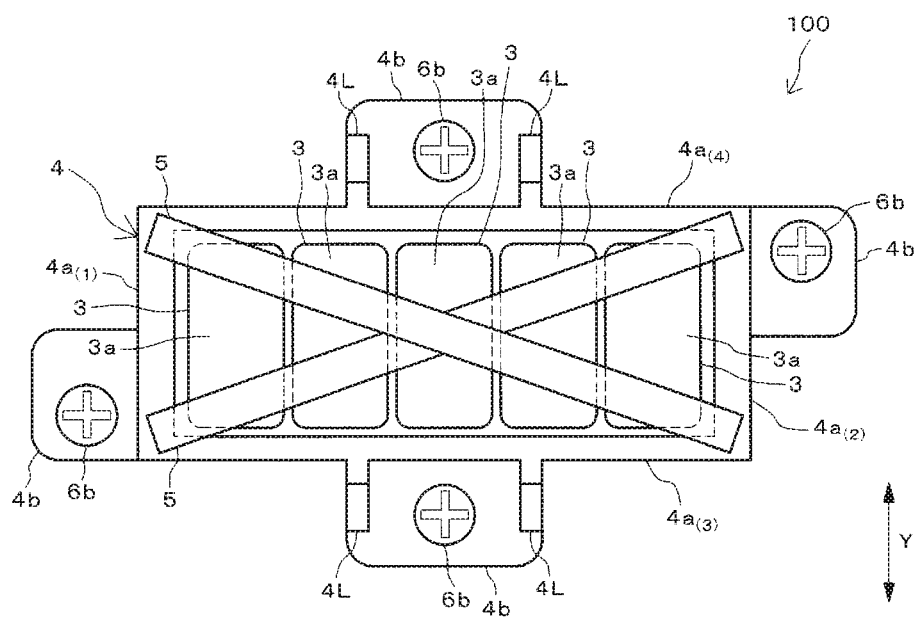
FIG. 11 is a plan view showing yet another embodiment of the present invention.

In the above embodiments, the example is shown in which the lead component 3 is connected to the rigid member 4 by the connecting member 5 in the long side direction X of the rigid member 4, but one or more embodiments of the present invention are not limited thereto only. In addition, for example, as shown in FIG. 10, the connecting member 5 may be provided above the rigid member 4 and the lead component 3 in the short side direction Y of the rigid member 4, so that the main portions 3a of the adjacent lead components 3 may be connected to each other by the connecting member 5 and the main body portion 3a of each lead component 3 may be connected to each of the side walls $4a_{(1)}$ to $4a_{(4)}$ of the rigid member 4 near the main body portion 3a by the connecting member 5. Further, as shown in FIG. 11, a connecting member 5 may be provided above the rigid member 4 and the lead component 3 so as to be oblique with respect to the long side direction X and the short side direction Y of the rigid member 4, thereby connecting the lead component 3 to the rigid member 4. In other words, the connecting direction between the lead component 3 and the rigid member 4 by the connecting member 5 may be appropriately set. Further, the number of times of performing the connecting step (applying step of the adhesive constituting the connecting member 5 or the like) may be appropriately set.

In the above embodiments, the circuit board 2 (printed circuit board) is taken as an example of the mounting member on which the lead component 3 is mounted, but one or more embodiments of the present invention are not limited thereto only. In addition, for example, a housing including an electrical connecting part and a bus bar or the like serving as an electrical wiring may be used as a mounting member, and a lead component may be mounted on the mounting member and be fixed by a rigid member.

In the above embodiments, the example is shown in which five lead components 3 made of an electrolytic capacitor are arranged, each of the main body portions 3a is surrounded by the rigid member 4, and at least the main body portions 3a disposed at both ends are connected with the rigid member 4 by the connecting member 5. However, one or more embodiments of the present invention are not limited thereto only. In addition, one or a plurality of insertion mount type electronic components or surface mount type electronic components other than electrolytic capacitors may be mounted on the circuit board 2, the main body portion of the electronic component may be surrounded by the rigid member 4, and some or all of the main body portions may be connected to the rigid members 4 by the connecting members 5. Further, a plurality of electronic components having different shapes and orientations may be surrounded by a rigid member and connected by a connecting member. Further, the shapes of the main body portion, a terminal, or the like of the electronic component are not limited to the shape similar to the lead component 3 described above.

Further, in the above embodiments, the example is shown in which one or more embodiments of the present invention is applied to the electronic device 100 including the vehicle mounted DC-DC converter installed in the vicinity of the engine of the vehicle, but it is also possible to apply one or more embodiments of the present invention to other vehicle mounted electronic device and an electronic device other than for vehicle mount use.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An electronic device comprising:
   an electronic component;
   a mounting member on which the electronic component is mounted, wherein a center of gravity of the electronic component is at a position separated from the mounting member;
   a rigid member having a frame shape, which is fixed to the mounting member and surrounds the electronic component in a direction perpendicular to a direction from the center of gravity of the electronic component to the mounting member; and
   a connecting member which connects the electronic component to the rigid member on a side opposite to the mounting member with respect to the electronic component,
   wherein, in a direction opposite the direction from the center of gravity of the electronic component to the mounting member, a part of the electronic component is exposed to an outside from the rigid member to the connecting member.

2. The electronic device according to claim 1,
   wherein a plurality of the electronic components are provided,
   wherein each of the electronic components comprises: a main body portion; and a connecting portion exposed from the main body portion and connected to the mounting member,
   wherein the plurality of electronic components are arranged on the mounting member such that the main body portions are close to each other, and
   wherein the connecting member connects the main body portions of the plurality of electronic components to each other and connects the main body portions of at least the electronic components disposed at both ends to the rigid member.

3. The electronic device according to claim 2,
   wherein the connecting member connects the main body portion of each of the electronic components to the rigid member.

4. The electronic device according to claim 2,
   wherein the plurality of electronic components have a same shape,
   wherein one of widths of the main body portion of each of the electronic components, the widths being in a direction parallel to a surface of the mounting member, is smaller than another of the widths, and
   wherein the plurality of electronic components are arranged such that the main body portions are adjacent to each other in a direction of the one width.

5. The electronic device according to claim 1,
   wherein the connecting member is made of an adhesive which has viscosity at a time of application and elasticity after curing.

6. The electronic device according to claim 1,
   wherein the mounting member is configured by a circuit board, and
   wherein the electronic component is configured by an electronic component of an insertion mount type which comprises a lead terminal connected to the circuit board in a state of the lead terminal being inserted into a through-hole formed in the circuit board.

* * * * *